(12) United States Patent
Speckels et al.

(10) Patent No.: US 7,851,334 B2
(45) Date of Patent: Dec. 14, 2010

(54) APPARATUS AND METHOD FOR PRODUCING SEMICONDUCTOR MODULES

(75) Inventors: Roland Speckels, Kamen (DE); Karsten Guth, Soest (DE); Hans Hartung, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 11/780,779

(22) Filed: Jul. 20, 2007

(65) Prior Publication Data
US 2009/0023250 A1 Jan. 22, 2009

(51) Int. Cl.
*H01L 21/00* (2006.01)
(52) U.S. Cl. .................. 438/464; 257/E21.499
(58) Field of Classification Search .......... 438/464; 257/E21.499
See application file for complete search history.

(56) References Cited

U.S. PATENT DOCUMENTS 5,622,900 A * 4/1997 Smith ................. 438/464
7,452,752 B2 * 11/2008 Noda et al. ............ 438/114
7,579,198 B2 * 8/2009 Hsu ...................... 438/22
2001/0000079 A1 * 3/2001 Usami et al. ........... 438/119
2005/0247760 A1 11/2005 Palm

FOREIGN PATENT DOCUMENTS

DE 102004019567 B3 1/2006
EP 1030349 B1 7/2004

OTHER PUBLICATIONS

Goebl et al., "Low temperature sinter technology, Die attachment for automotive power electronic applications", Automotive Power Electronics, Jun. 21-22, 2006, Paris, pp. 1-5.

* cited by examiner

*Primary Examiner*—David A Zarneke
*Assistant Examiner*—Jenny L Wagner
(74) *Attorney, Agent, or Firm*—Dicke, Billig & Czaja, PLLC

(57) ABSTRACT

An apparatus and method for producing semiconductor modules is disclosed. One embodiment provides for bonding at least one semiconductor die onto a carrier including a support film strip, the support film having applied an adhesive layer to one of its surfaces to attach the semiconductor die, and a pressure tool to press the semiconductor die and the support film strip onto the carrier to permanently contact the at least one semiconductor die to the carrier.

21 Claims, 3 Drawing Sheets

APPARATUS AND METHOD FOR PRODUCING SEMICONDUCTOR MODULES

BACKGROUND

The invention relates to an apparatus for producing a semiconductor and a method to producing the semiconductor.

A semiconductor module includes a semiconductor chip that is typically mounted onto a carrier, for example a ceramic substrate, for dissipation of heat away from the operational semiconductor chip. The semiconductor chip includes electrical circuits and contact pads which are connected to the electrical circuit. The contact pads may be connected to external contact pads which are arranged on the carrier by using strip lines, wires, etc.

The exact positioning of the semiconductor chips relative to the carrier during assembly of the module is a technically challenging task. Especially in combination with modern low-temperature joining techniques (LTJT) for bonding the semiconductor chips to the carrier (e.g., a DCB substrate) known appliances employing positioning-frames to position semiconductor chips on the substrate do not render satisfactory results.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an apparatus for bonding at least one semiconductor die onto a carrier. One embodiment includes a support film strip, the support film having applied an adhesive layer to one of its surfaces to attach the semiconductor die; and a pressure tool to press the semiconductor die and the support film strip onto the carrier to permanently contact the at least one semiconductor die to the carrier.

Another embodiment provides a method for bonding a semiconductor die to a carrier: providing a support film strip, the support film strip includes an adhesive layer; arranging the semiconductor die onto the support film strip in a predetermined layout, the at semiconductor die being attached to the support film strip by the adhesive layer; pressing the support film strip onto the carrier with a given pressure; and subjecting the semiconductor die and the carrier to a given temperature.

FIGS. 1 to 5 illustrate an exemplary apparatus for producing a semiconductor module. The method for producing a semiconductor module can also been derived from the Figures.

Figure 1:
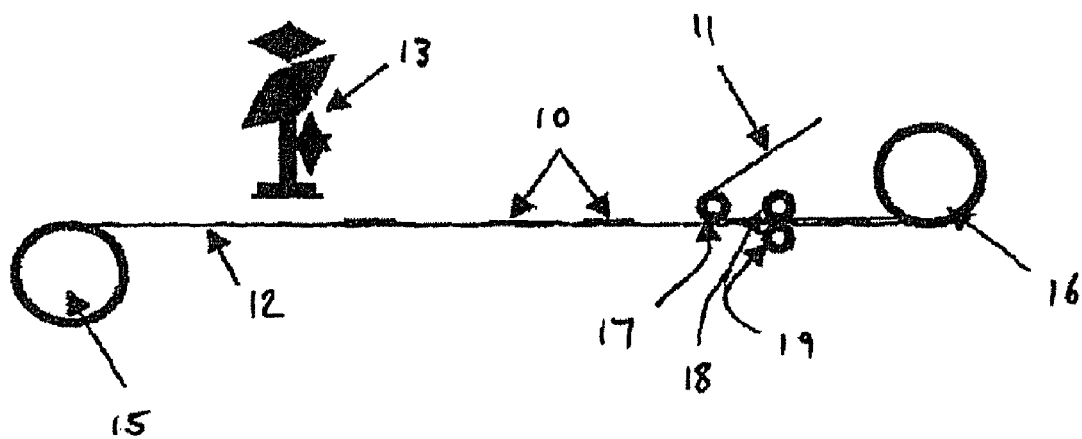
FIG. 1 illustrates a first part of an exemplary apparatus to produce a semiconductor module.

FIG. 1 illustrates a first part of an apparatus according to one embodiment of the invention.

A support film strip 12 is provided by a decoiler 15 and received by a coiler 16 (which may later act as decoiler 16'). Between decoiler 15 and coiler 16 the support film strip 12 is conducted within a horizontal plane and supported by two pinch rollers 18 and 19. A pick-and-place tool 13 is adapted for arranging one or more semiconductor chips (i.e. dice 10) onto the support film strip 12 according to a given layout. The support film strip 12 therefore has an adhesive layer 30 (cf. FIG. 4) applied to its upper surface for keeping the dice 10 in a fixed position relative to each other. Some demands have to be met by the adhesive layer 30, which will be explained later in more detail.

A deflective roller 17 is juxtaposed to the support film strip 12 and a tape-shaped protective sheet 11 is guided around the deflective roller 17, such that the protective sheet 11 is deflected into a direction parallel to the support film strip 12. The support film strip 12 is thus covered by the protective sheet and the semiconductor dice 10 are enclosed between the support film strip 12 and the protective sheet 11.

The tape-shaped protective sheet 11 may be provided by another decoiler not illustrated in FIG. 1. The aforementioned pinch rollers 18 and 19 are configured to press the protective sheet 11 and the support film strip together in order to ensure a good contact. In the exemplary arrangement illustrated in FIG. 1 the support film strip 12 moves from the left to the right side and is, together with the semiconductor dice 10 and the protective sheet 11, wrapped around coiler 16.

The semiconductor chip 10 includes a passive surface, which is also referred to as a back surface, and an active surface that is opposite to the passive surface. The active surface includes contact pads and is also referred to as a front surface. The pick-and-place tool 13 arranges the semiconductor chip 10 on the support film strip 12 such that the active surface is in contact with the support film strip 12.

The support film strip 12 is formed of a material which is able to withstand elevated temperature during the production process. The adhesive layer 30 applied to the support film strip 12 is configured to at least partially harden and to lose its adhesive strength when subjected to pressure, or elevated temperature, or both pressure and elevated temperature.

Figure 2:
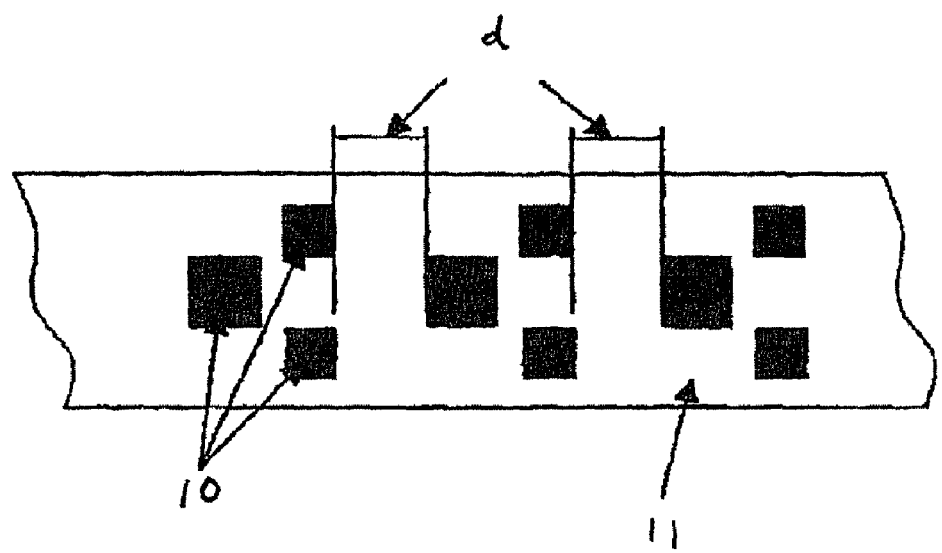
FIG. 2 illustrates a partial top view of FIG. 1.

FIG. 2 illustrates a partial top view of the support film strip 12 populated with semiconductor dice 10 as depicted in FIG. 1. The semiconductor dice 10 are arranged in a predetermined layout on the support film strip 12. A set of semiconductor dice 10 is separated from a subsequent set of semiconductor dice 10 by a distance d. One set of semiconductor dice 10 will later be mounted onto a carrier (e.g., a ceramic substrate, DCB-substrate, etc.) simultaneously in one process.

Figure 3:
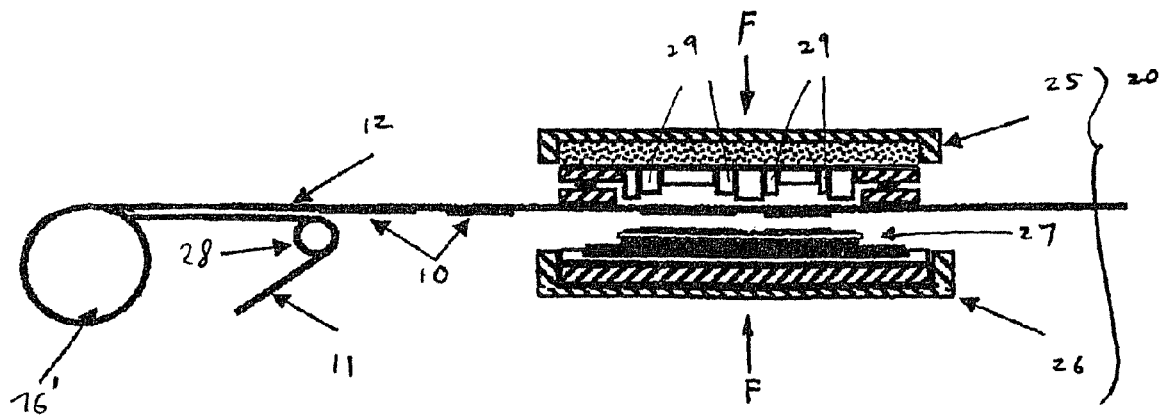
FIG. 3 illustrates a second part of the exemplary apparatus to produce a semiconductor module.

FIG. 3 illustrates a second part of an apparatus according to one embodiment. Coiler 16 of FIG. 1 may either act as decoiler 16' of FIG. 3, or the support film strip 12 (together with the dice and the protective sheet 11) may be transferred to a separate decoiler 16' before further processing of the semiconductor dice 10. The decoiler 16' is unwrapped and the support film strip 12 is—together with the semiconductor dice 10—conducted in a horizontal direction between the upper (25) and the lower (26) part of a sintering-tool 20. The support film strip 12 is guided through the sintering-tool 20 above a carrier 27, whereon the semiconductor dice 10 are to be mounted. Thereby the support film strip 12 may be guided by another roller (not illustrated). The carrier (e.g., ceramic substrate) 27 is arranged within the lower part 26 of the sintering-tool 20, whereas the upper part 25 of the sintering-tool 20 includes protrusions 29 matching the desired layout of the semiconductor dice 10 on the carrier 27 to apply a defined pressure to the semiconductor dice 10, when pressing the upper part 25 of the sintering-tool towards the lower part 26. The pressing on of the semiconductor dice 10 to the carrier 27 is explained in more detail with reference to FIG. 4.

In the arrangement of FIG. 3, the support film strip 12 moves from the left side to the right side while being unwrapped from decoiler 16'. Before entering the sintering-tool 20 the protective sheet 11 is detached from the support film strip 12 and the semiconductor dice 10. Therefore the tape-shaped protective sheet is guided around another deflective roller 28 and deflected in a direction pointing away from the support film strip 12.

Figure 4:
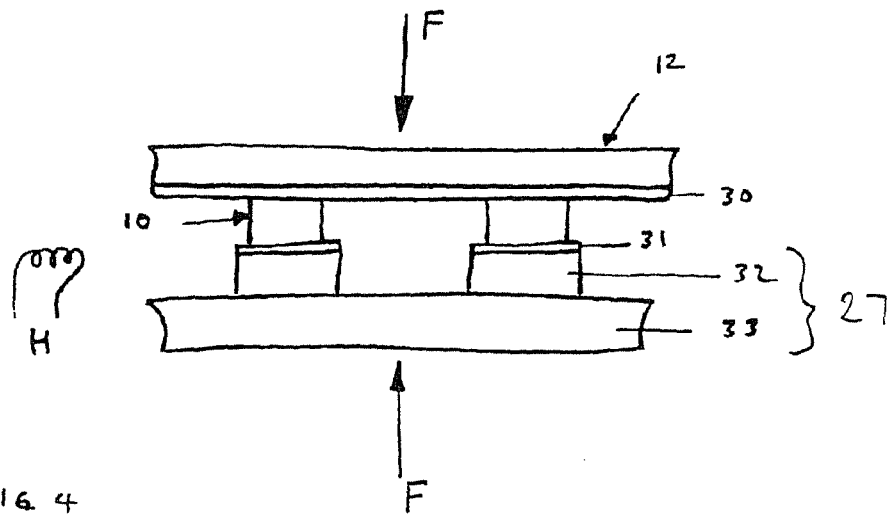
FIG. 4 illustrates a process of bonding the semiconductor devices onto a carrier.

FIG. 4 illustrates the support film strip 12, the semiconductor dice 10 and the carrier 27 of FIGS. 1 to 3 while being pressed together by the sintering-tool; the sintering-tool itself is not illustrated. The semiconductor dice 10 are attached to the support film strip 12 with the aid of the adhesive layer 30 applied to a lower side of the support film strip 12 (which corresponds to the upper side of the support film strip 12 of FIG. 1).

The carrier 27 is arranged under the semiconductor dice 10 and the semiconductor dice 10 are positioned above the carrier 27 such that the layout of the semiconductor dice 10 matches (i.e. is congruent to) a desired layout of the semiconductor dice 10 on the carrier. The carrier may include a substrate 33, a patterned metallization layer 32 for forming conductive paths on the substrate 33, and a paste layer 31 (substituting conventional solder) coated onto the metallisation layer 32 for sinter-bonding metallisation layer 32 and semiconductor dice 10. The paste 31 includes metal powder, e.g., silver or silver alloy powder. The powder is used as sintering material.

The dried paste 31 has a thickness ranging from about 10 μm (micrometer) to about 20 μm. A heat source H is placed near or within the sintering tool 20 for providing a necessary temperature to harden the paste 31 and to finish the sintering while the semiconductor dice 10 are pressed against the carrier 27 by a force F applied to the semiconductor tool 20 as indicated by the force-vectors F fn FIG. 3.

During the sintering process the adhesive layer 30 hardens and loses its adhesive strength due to pressure and heat, so that the semiconductor device is easily detached from the support film strip 12 after the pressure is relieved by the sintering-tool 20.

Figure 5:
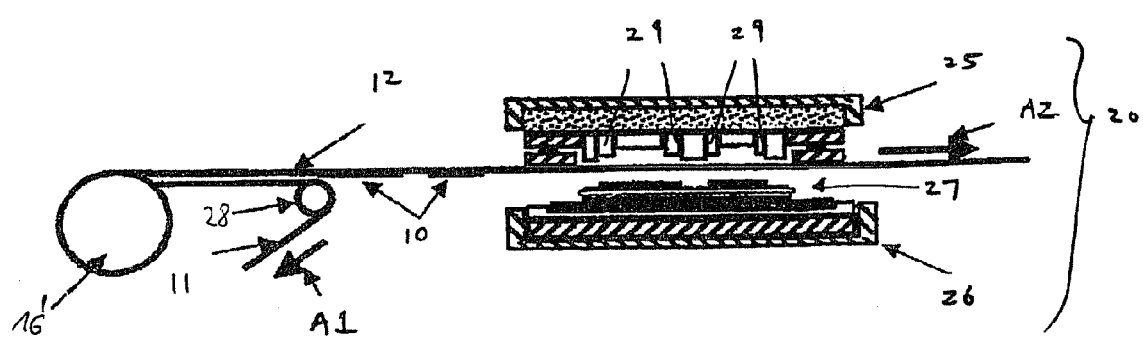
FIG. 5 illustrates a second part of the exemplary apparatus to produce a semiconductor module, after the bonding of the semiconductor dice.

FIG. 5 illustrates the semiconductor dice 10 readily mounted onto the carrier 27. The populated carrier 27 can be removed and replaced by a subsequent empty carrier. The support film strip 12 is conducted forward in a direction indicated by the arrow A2, while protective sheet 11 moves in a direction indicated by arrow A1. A new set of semiconductor dice 10 (cf. FIG. 2) is thus transported into the sintering-tool 20, in order to be mounted to the empty carrier.

The illustrated example here illustrates semiconductor dice 10 having an electronic component integrated therein. The electronic component may be realized in the form of a power semiconductor chip, which is able to handle high voltage or high current. Examples of the power semiconductor chip are diodes, transistors (MOSFETs, IGBTs), thyristors, triacs, etc. The electronic components integrated in different semiconductor dice can be connected by using wires, strip lines (formed by the patterned metallisation layer), etc in order to form an electronic circuit.

The sintering tool 20 as provided here is an example of a pressure application tool to press the semiconductor chip 10 onto the substrate 33. Any kind of pressure application tool fulfilling the same function will be appropriate. The pick-and-place tool 13 (cf. FIG. 1) as provided here serves to place the semiconductor chips 10 onto the adhesive tape 11 in a predetermined layout. Of course other suitable means for placing semiconductor dice onto the support film strip is appropriate.

As an alternative, the coiler 16 and the decoiler 16' could be omitted. The support film strip 12 (together with dice 10 and protective sheet 11) then has to be turned around after covering the dice with the protective sheet 11 in order to put the dice upside down.

To avoid the requirement of turning the support film strip 12, the dice 10 and the protective sheet 11 upside down, the protective sheet 11 and the support film strip 12 in FIG. 1 may be interchanged. The set of dice 10 are the arranged on the protective sheet 11 instead of the support film strip and are later covered by the support film strip 12. In this case the dice have to be arranged on the protective sheet 11 with their passive surface (back surface) contacting the protective sheet 11. In order to be able to later detach the protective sheet 11 as illustrated in FIG. 3 the protective sheet must include an adhesive film whose adhesive strength is weaker than the adhesive strength of the adhesive film on the support film strip 12. This is to ensure the semiconductor dice 10 remain attached to the support film strip 12 when detaching the protective sheet 11.

An example of a method of producing the semiconductor module includes a first process of providing the support film strip 12, as illustrated in FIG. 1. One end of the support film strip 12 is unwrapped from decoiler 15 whilst the other end of the support film strip 12 is wrapped around coiler 16. The pick-and-place tool 13 picks one ore more semiconductor dice 10 from a sawn wafer and places the semiconductor dice 10 onto the support film strip 12 in a predetermined layout as illustrated in FIG. 2.

The first stationary deflection roller 17 then guides the tape-shaped protective sheet 11 onto the semiconductor dice 10 that have been attached onto the adhesive tape 11, as illustrated in FIG. 1. The pinch rollers upper 18 and 19 afterward presses the protective sheet 11 and the support film strip 12 together, such that the semiconductor chip 10 is enclosed in between. The semiconductor dice 10 are thereby maintained in a fixed relation to each other, according to a predefined layout, and are not able to move relatively to each other during the whole subsequent production process.

In a second process of the examplary method, the support film strip 12 with the semiconductor dice 10 and the protective sheet 11 attached thereon are unwrapped from decoiler 16', as illustrated in FIG. 3. The protective sheet 11 is then guided around the second stationary deflection roller 28 (away from the support film strip 12) and thereby detached from the support film strip 12 and the semiconductor dice 10. The support film strip 12 is guided between the upper (25) and lower (26) part of the sintering tool 20, as illustrated in FIG. 3. A carrier 27 is provided within the lower part of the sintering tool for receiving the semiconductor dice 10 in a subsequent process.

In a third process of the examplary method, the sintering tool 20 "closes", such that the upper and lower part 25 and 26 clamps the support film strip 12 together with the semiconductor dice 10 onto the paste layer 31 provided on the carrier 27 as illustrated in FIG. 4. The semiconductor dice 10 have been arranged on the support film strip 12 in a predefined layout, that corresponds to a layout of the paste layer 31, i.e. the paste layer 31 may be patterned according to the layout of the semiconductor dice 10.

A heat source H elevates the temperature within the sintering-tool 20 to a sintering temperature of at least about 220° C. (degrees Celsius) for a given period of time. A typical temperature for sintering ranges from 220° C. to 260° C. The sintering tool 20, when closed, exerts a pressure of at least about 30 MPa onto the semiconductor dice 10, the paste layer 31 and the substrate 33, according to the force vector F depicted in FIG. 3 or 4. The elevated temperature and the pressure cause the metal powder within the paste layer 31 to fix semiconductor chip 10 onto the substrate 33. The process of fixing, respectively bonding, of semiconductor chip to a carrier under pressure and at elevated temperature is also known as pressure sintering or pressure bonding. Furthermore the elevated temperature causes the adhesive layer 30 to weaken in adhesion.

In the fourth process of the examplary method, the upper part 25 is separated from the lower part 26 of the sintering tool, as illustrated in the FIG. 5, and pressure is relieved. The adhesive, being weaken in adhesion, allows the support film strip 12 to be separated from the semiconductor dice 10 whilst the semiconductor chip 10 "sticks" to the substrate 33 by using paste layer 31.

The examplary method provides a reliable and simple way of positioning the semiconductor dice 10 on a carrier 27 by the use of a support film strip 12. The semiconductor dice are kept aligned according to a predefined layout. A misalignment of the semiconductor dice 10 which would easily damage the edges of the semiconductor dice 10, is thereby prevented.

Although example of the present invention have been described herein above in detail, it is desired, to emphasis that this has been for the purpose of illustrating the present invention and should not be considered as necessarily limitative of the invention, it being understood that many modifications and variations can be made by those skilled in the art while still practising the invention claimed herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method comprising:
   providing a flexible support film, the support film comprising an adhesive layer;
   providing a plurality of single semiconductor dice that are not fixedly connected to each other;
   arranging each of the plurality of single semiconductor dice one at a time onto the support film in a predetermined layout, each of the plurality of single semiconductor dice being attached to the support film by the adhesive layer; and
   pressing the support film onto a carrier to fixedly mount a predetermined number of the semiconductor dice onto the carrier.

2. The method of claim 1, comprising:
   subjecting each of the plurality of single semiconductor dice and the carrier to a given temperature and to a given pressure.

3. The method of claim 2, wherein the adhesive layer weakens in adhesion when subjected to the given pressure.

4. The method of claim 2, wherein the adhesive layer weakens in adhesion when subjected to the given temperature.

5. The method of claim 1, comprising defining the carrier to have a paste layer applied to a surface of the carrier oriented towards each of the plurality of single semiconductor dice.

6. The method of claim 5, where the paste layer comprises metal powder.

7. The method of claim 5, where the paste layer comprises metal powder of silver or a silver alloy.

8. The method of claim 1, wherein a surface of the carrier has a patterned metallization layer deposited thereon to form a plurality of pads and strip lines for connecting the semiconductor dice, the paste layer being deposited at least partially onto the metallization layer.

9. The method of claim 1, wherein pressing the support film onto the carrier comprises pressing the support film onto the carrier to fixedly mount at least two of the semiconductor dice onto the carrier.

10. A method for fabricating a semiconductor device, the method comprising:
    providing a flexible support film comprising an adhesive layer;
    providing a plurality of single semiconductor dice that are not fixedly connected to each other;
    arranging each of the plurality of single semiconductor dice one at a time onto the support film in a predetermined layout, each of the plurality of single semiconductor dice being attached to the support film by the adhesive layer;
    applying a protective sheet over the plurality of single semiconductor dice attached to the support film;
    detaching the protective sheet from the plurality of single semiconductor dice; and
    pressing the support film onto a carrier to fixedly mount a predetermined number of the semiconductor dice onto the carrier.

11. The method of claim 10, wherein pressing the support film onto the carrier comprises pressing the support film onto the carrier to fixedly mount a predetermined number of the semiconductor dice onto the carrier via sintering.

12. The method of claim 10, wherein providing the flexible support film comprises providing the flexible support film on a decoiler and decoiling a portion of the flexible support film prior to arranging each of the plurality of single semiconductor dice one at a time onto the support film.

13. The method of claim 10, further comprising:
coiling the support film with the applied protective sheet on a coiler prior to detaching the protective sheet.

14. The method of claim 10, wherein applying the protective sheet comprises applying a protective sheet comprising an adhesive layer.

15. The method of claim 14, wherein the adhesive strength of the adhesive layer of the protective sheet is weaker than the adhesive strength of the adhesive layer of the support film.

16. The method of claim 10, wherein pressing the support film onto the carrier comprises pressing the support film onto the carrier such that the predetermined layout of the semiconductor dice is maintained on the carrier.

17. A method for fabricating a semiconductor module, the method comprising:
providing a flexible support film comprising an adhesive layer;
providing a plurality of single semiconductor dice that are not fixedly connected to each other;
arranging a predetermined number of the single semiconductor dice one at a time onto the support film in a predetermined layout, each of the predetermined number of single semiconductor dice being attached to the support film by the adhesive layer;
guiding the support film with the attached predetermined number of semiconductor dice into a sintering tool;
closing the sintering tool such that the support film together with the attached predetermined number of semiconductor dice are pressed onto a paste layer provided on a carrier, the paste layer patterned according to the predetermined layout;
applying a sintering temperature and a pressure to the predetermined number of semiconductor dice such that the paste layer is sintered to fixedly mount the predetermined number of semiconductor dice onto the carrier in the predetermined layout.

18. The method of claim 17, wherein arranging the predetermined number of the single semiconductor dice onto the support film comprises arranging at least two of the single semiconductor dice onto the support film in the predetermined layout.

19. The method of claim 17, wherein providing the flexible support film comprises providing the flexible support film on a decoiler and decoiling a portion of the flexible support film prior to arranging the predetermined number of single semiconductor dice one at a time onto the support film.

20. The method of claim 17, further comprising:
applying a protective sheet over the predetermined number of single semiconductor dice attached to the support film; and
detaching the protective sheet from the predetermined number of single semiconductor dice prior to guiding the support film into the sintering tool.

21. A method for fabricating a semiconductor module comprising:
individually attaching a first major surface of each semiconductor die of a plurality of semiconductor dice to an adhesive layer on a first side of a flexible support film, the plurality of semiconductor dice arranged in a predetermined layout;
applying a force to a second side of the flexible support film opposite the first side to press and fixedly mount a second major surface of each semiconductor dice opposite the first major surface to a carrier; and
removing the flexible support film leaving the semiconductor dice mounted to the carrier in the predetermined layout.

* * * * *